(12) United States Patent
Reising et al.

(10) Patent No.: US 8,740,536 B2
(45) Date of Patent: Jun. 3, 2014

(54) METHOD AND DEVICE FOR INTRODUCING AND REMOVING SUBSTRATES

(75) Inventors: Michael Reising, Mömbris (DE); Stefan Kempf, Alzenau (DE)

(73) Assignee: Singulus Technologies AG, Kahl am Main (DE)

( * ) Notice: Subject to any disclaimer, the term of this patent is extended or adjusted under 35 U.S.C. 154(b) by 186 days.

(21) Appl. No.: 13/138,713

(22) PCT Filed: Apr. 23, 2010

(86) PCT No.: PCT/EP2010/055455
§ 371 (c)(1),
(2), (4) Date: Sep. 21, 2011

(87) PCT Pub. No.: WO2010/122153
PCT Pub. Date: Oct. 28, 2010

(65) Prior Publication Data
US 2012/0027543 A1 Feb. 2, 2012

(30) Foreign Application Priority Data

Apr. 24, 2009 (DE) .......................... 10 2009 018 777
Aug. 12, 2009 (DE) .......................... 10 2009 037 291

(51) Int. Cl.
*H01L 21/67* (2006.01)

(52) U.S. Cl.
USPC ........................................... 414/217; 414/939

(58) Field of Classification Search
None
See application file for complete search history.

(56) References Cited

U.S. PATENT DOCUMENTS

| 5,095,927 A * | 3/1992 | Thompson et al. ........ 134/102.1 |
| 5,590,994 A | 1/1997 | Schertler ........................ 414/217 |
| 5,820,329 A | 10/1998 | Derbinski et al. ............ 414/225 |
| 5,896,674 A | 4/1999 | Kim et al. ........................ 34/480 |
| 5,992,638 A | 11/1999 | Gregerson et al. ............ 206/711 |
| 6,139,591 A * | 10/2000 | Nakaura et al. ............. 29/25.01 |
| 6,535,628 B2 * | 3/2003 | Smargiassi et al. ........... 382/149 |
| 2002/0074635 A1 | 6/2002 | Hattori et al. ................. 257/678 |
| 2004/0040587 A1 | 3/2004 | Lim et al. ...................... 134/113 |
| 2005/0183665 A1 * | 8/2005 | Lee et al. ....................... 118/715 |
| 2007/0134078 A1 | 6/2007 | Rogers et al. ................. 414/281 |

* cited by examiner

*Primary Examiner* — James Keenan
(74) *Attorney, Agent, or Firm* — Ohlandt, Greeley, Ruggiero & Perle, LLP

(57) ABSTRACT

The invention describes a method and a device for introducing and removing substrates. Substrates (5) are transported into a lock (2) by a transport element (4). A collection container (3) is located in the lock below the substrates (5) for collecting possible substrate fragments (19). The substrates (5) are removed together with the collection container (3) and the lock cover (18) once the lock (2) has been flooded. The lock cover (18) and the collection container (3) form an almost closed box around the substrates (5). After the substrates (5) have been replaced and the collection container (3) has been emptied, the new substrates (5) are introduced together with the collection container. All the steps are carried out in the machine cycle to ensure an effective production process.

12 Claims, 3 Drawing Sheets

METHOD AND DEVICE FOR INTRODUCING AND REMOVING SUBSTRATES

This patent Application is a US National Phase patent application from PCT Application No. PCT/EP2010/055455 filed Apr. 23, 2010 and claiming priority from German Patent Applications Nos. 10 2009 018 777.4 filed Apr. 24, 2009 and 10 2009 037 291.1 filed Aug. 12, 2009.

FIELD OF THE INVENTION

The present invention relates to a method and a device for introducing and removing substrates into and out of a production facility or machine. In particular, it describes a method and a device in which damage to vacuum seals caused by substrate fragments and disturbance of the machine or facility are avoided.

BACKGROUND TO THE INVENTION

In facilities or machines, substrates must often be introduced and removed. Present machines work in the continuous mode or in the batch mode. In the continuous mode, the substrates are transported one after the other through the facility. In the batch mode, the substrates are transported in packets or stacks to working or treatment areas of the facility. Then, the substrates are delivered to the next process area in packeted or stacked form. In this method, possibly generated substrate fragments can cause a facility stop when the facility has to be stopped for transporting the substrate fragments out of the facility. There is the risk that substrate fragments which are not collected and directly transported out of the facility damage or contaminate seals and other components of the lock. Moreover, the substrates should be introduced in and removed from a system that is protected as much as possible in order to prevent air turbulences above and below the substrates, so that the substrates do not fracture.

Devices for introducing and removing substrates are known, e.g., from U.S. Pat. No. 5,992,638 A and US 2007-0134078 A1.

SUMMARY OF THE INVENTION

In view of the above-mentioned problems of the prior art, it is an object of the present invention to provide a method and a device in which possible substrate fragments do not remain in the lock area but are removed from the facility during the machine cycle. It is a further object to reduce the risk of a machine stop caused by substrate fragments in the lock. Moreover, the risk of swirled-up fragments, which deposit on substrates or vacuum sealing surfaces, should be reduced. It is a further object of the invention to avoid any load on the substrates caused by turbulent air flows. These and other objects are achieved by the features of the claims.

In achieving these objects, the invention starts out from the following basic idea: Substrate fragments are removed from the facility or machine by means of a collection container together with finished substrates. The collection container is removed together with the substrates during the machine cycle so that the production process is not disturbed when the substrate fragments are removed and no additional working cycle is required.

The device for introducing and removing substrates comprises a lock. Processed substrates are transported into the lock area by using a transport means. The substrates can be held by a substrate support. A collection container in the lock area collects the substrate fragments that may possibly be formed during introduction and removal. The processed substrates are removed during the machine cycle together with the collection container and possibly present substrate fragments. This means that the steps of transporting the substrates into the lock, sealing and flooding the lock, removing the collection container, the substrates and the substrate fragments, emptying the collection container, delivering the processed substrates to a device outside the facility, introducing untreated substrates together with a collection container, evacuating the lock and transporting the substrates out of the lock take place in the machine cycle.

Together with a lock cover, the collection container forms an almost closed box which holds disturbing environmental influences off the substrate and thus reduces damage to the substrates during introduction and removal. When the substrates are removed, the collection container is lifted and thus separates the substrate support with the substrates from the transport means. Then, the substrate support is removed together with the substrates and the collection container. When the substrates are introduced, the collection container is lowered and delivers the substrate support with the substrates to the transport means.

Outside the facility or machine, the collection container with the substrate fragments is separated from the substrate support and the substrates. The substrate support with the substrates is delivered to a device. The collection container is emptied. Alternatively, it is checked first whether there are substrate fragments in the collection container. In this case the collection container is only emptied if it in fact contains substrate fragments. Then, the collection container is provided for introduction together with a substrate support with new substrates.

The lock cover provided at the lock can be cap-shaped. When a flat lock cover is used, the volume to be evacuated is kept low. Thus, the lock volume can be evacuated or flooded quickly. Each lock cover can always engage with the same collection container.

The transport means for transporting the substrates within the facility can comprise a rotary plate. For sealing the lock area, the rotary plate can have a deflectable sealing frame, as described, e.g., in the patent application entitled "Transport means having a deflectable sealing frame" filed at the same date.

BRIEF DESCRIPTION OF THE DRAWINGS

In the following, the invention will be explained in more detail with reference to the drawings in which.

DETAILED DESCRIPTION OF THE INVENTION

Figure 1A:
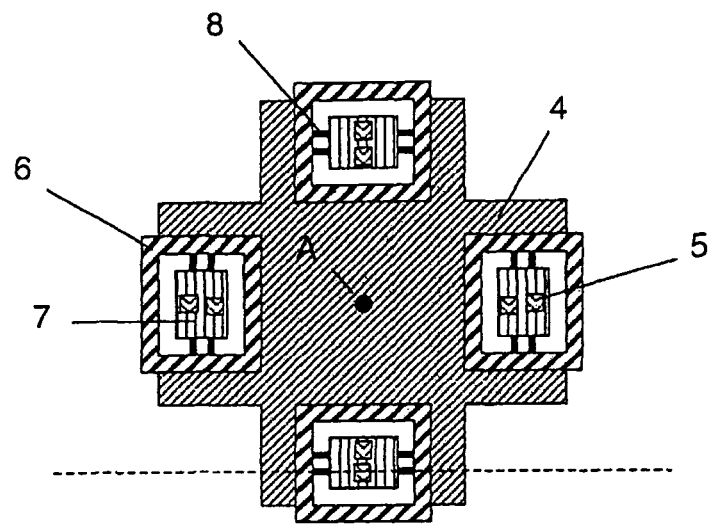
FIG. 1a shows a top view of a transport means.

FIG. 1a shows a top view of a transport means 4 of a facility or machine for substrates 5. The transport means 4 comprises deflectable sealing frames 6 and substrates supports 7. The substrate supports 7 are attached to the deflectable sealing frames 6 by suspension means 8. Substrates 5 are located on the substrate supports 7. As shown in FIG. 1*a*, the transport means 4 is realized, e.g., as rotary plate. The rotary plate 4 can rotate about the axis A being perpendicular with respect to the drawings plane. After a certain rotation (here 90°), another sealing frame 6 with substrate support 7 and substrate 5 thus enters a specific working area (e.g. lock area, heating area, process area, etc.) of a facility or machine. The transporting means 4 transports the substrates 5 in an XY-plane (corresponding to the drawing plane of FIG. 1*a*). Alternatively, however, also a transport means which transports a substrate 5 linearly in the XY-plane is possible.

Figure 1B:
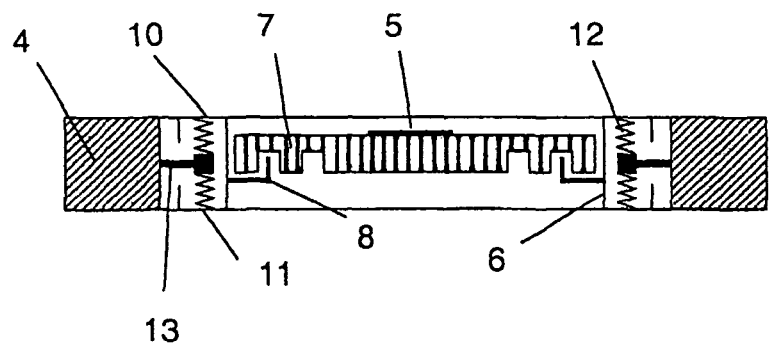
FIG. 1b shows a sectional view along the dashed line in FIG. 1a, FIG. 2a shows a schematic view of a device according to the invention for introducing and removing substrates, in which a transport means transports a substrate into the lock area.

FIG. 1*b* shows a sectional view along the dashed line of FIG. 1*a*. The vertical direction of FIG. 1*b* corresponds to the Z-direction. The substrate 5 is held by the substrate support 7. The substrate support 7 in turn is held by the suspension means 8 and is thus connected with the deflectable sealing frame 6. The deflectable sealing frame 6 has two sealing surfaces 10, 11 in the Z-direction. Two springs 12 are shown inside the sealing frame 6. As shown in FIG. 1*b*, the springs 12 are connected by means of a connector 13 with the transport means 4. The springs 12 hold the sealing frame 6 in a central position without the influence of an external force in the Z-direction relative to the thickness of the transport means 4 measured in the Z-direction. By the influence of an external force on one of the sealing surfaces 10, 11 of the deflectable sealing frame 6, the latter can be deflected by a defined distance in the Z-direction. Alternatively, the sealing frame 6 can be connected with the transport means 4 by using leaf springs. A plurality of leaf springs are then mounted in the XY-plane as guidance and prevent a movement in the XY-plane relative to the transport means 4 when the sealing frame 6 is deflected.

Figure 2A:
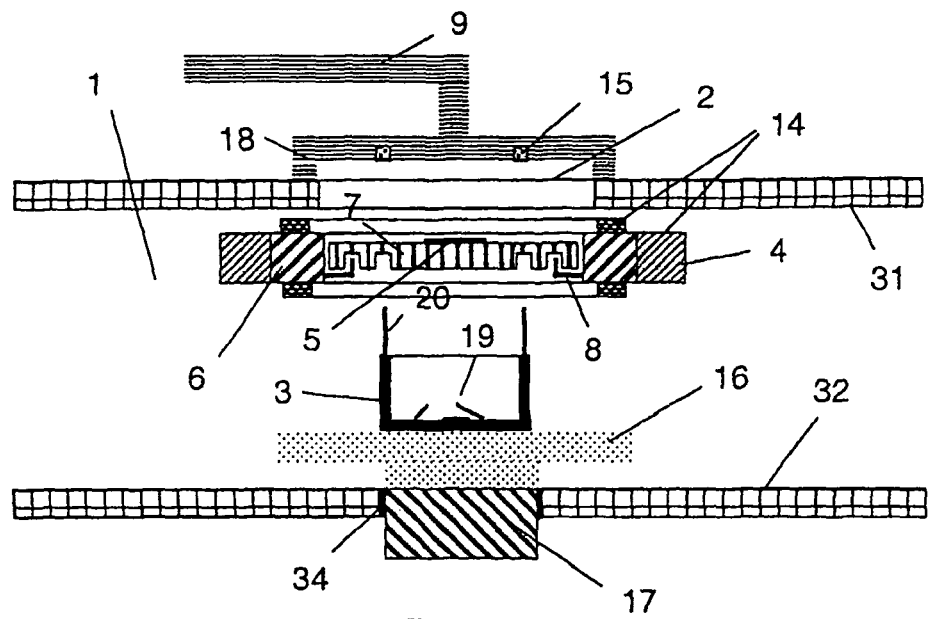
FIG. 2b shows a schematic view of a device according to the invention for introducing and removing substrates, in which a collection container receives the substrate support with the substrates when the lock area is sealed.
FIG. 2c shows a schematic view of a device according to the invention for introducing and removing substrates, in which the collection container with substrate fragments is removed together with the substrates.
Figure 2B:
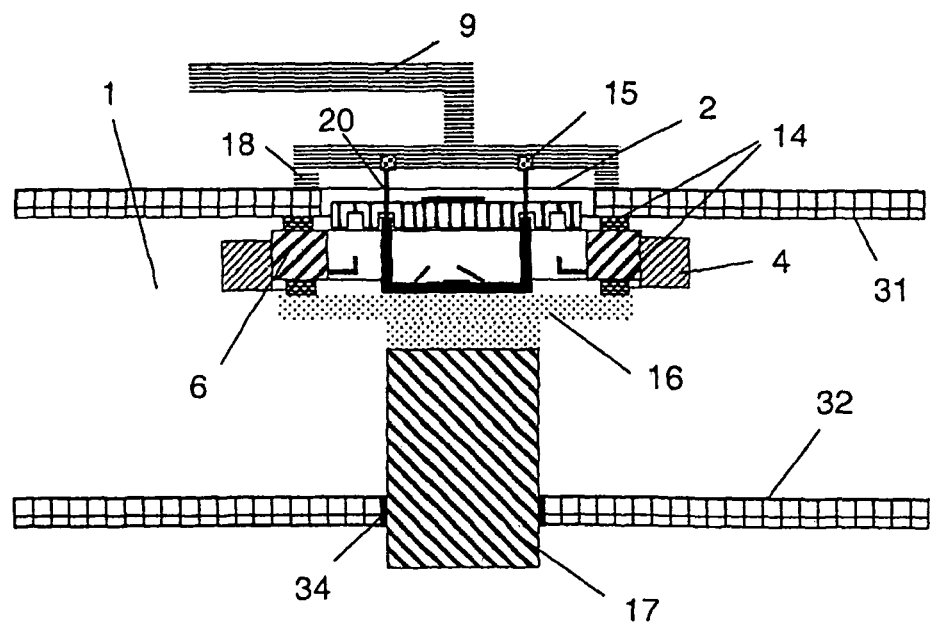
Figure 2C:
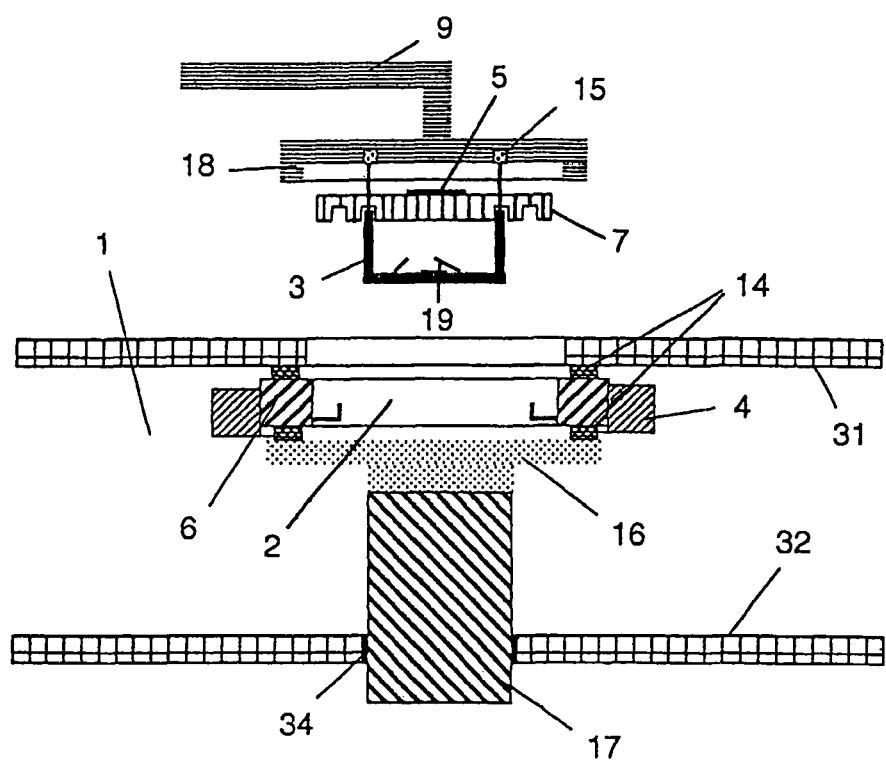

FIGS. 2*a*, 2*b* and 2*c* show a substrate 5 while being removed. FIG. 2*a* shows the lock area 2 of the facility after a substrate support 7 with the substrate 5 has been transported into the lock area 2 by using a transport means 4. A collection container 3 for substrate fragments 19 is provided below the substrate support 7. In particular while introducing and removing the substrates, the evacuation and flooding and/or the movement of the substrates 5 may cause the substrates to fracture. The substrate support 7 is configured such that the substrate fragments 19 fall through or past the substrate support 7 into the collection container 3. The collection container 3 is arranged on a closure means 16. The closure means 16 is connected with a lifting means 17 in the bottom 32 of the chamber. By way of a vacuum duct 34, the lifting means 17 is passed through the bottom 32 of the chamber in a vacuum-tight manner. Above the substrate support 7, there is a lock cover 18 which, in its closed state, seals the chamber 1 or the lock 2 in a vacuum-tight manner against the top 31 of the chamber. The lock cover 18 is connected with an arm 9 for moving the lock cover.

For removing the substrates 5, the lock area 2 must be sealed against the chamber 1 of the facility or machine being under vacuum, so that it can be flooded. As shown in FIG. 2*b*, to this end a lifting means 17 in the bottom 32 of the chamber lifts a closure means 16 below the lock area 2. While being lifted, the closure means 16 contacts the lower O-ring 14 of the deflectable sealing frame 6. Thus, the deflectable sealing frame 6 is deflected upwardly in the Z-direction perpendicular with respect to the XY-plane. The sealing frame 6 is deflected until the second, i.e. upper O-ring 14 of the sealing frame 6 seals against the top 31 of the chamber. Alternatively, the O-rings 14 can also be attached to the closure means 16 or the top 31 of the chamber. A separated vacuum space, which can be flooded, is formed in the chamber 1. By lifting the closure means 16 by using the lifting means 17, at the same time also the collection container 3 is lifted. Thus, the collection container 3 receives the substrate support 7 and lifts it out of the suspension means 8 of the deflectable sealing frame 6. As shown in FIG. 2*b*, centering pins 20 of the collection container 3 extend through suitable bores in the substrate support 7 for providing a connection and guidance between collection container 3 and substrate support 7. For attaching the collection container 3 to the lock cover 18 by means of the collection container fixing means 15, in the shown embodiment the centering pins 20 are sufficiently long, so that they can engage with the collection container fixing means. Alternatively, the centering tips move in recesses on the lower side of the substrate support without extending through it.

FIG. 2*c* shows the removal of the substrates 5 from the chamber 1 or the lock 2 of the facility. The substrates 5 are lifted out of the facility together with the substrate support 7 and the collection container 3 with the substrate fragments 19. The collection container 3 is connected with the lock cover 18. Collection container 3 and lock cover 18 form together an almost closed box around the substrates 5. Thus, the air volume above and below the substrates 5 between the lock cover 18 and the collection container 3 is minimized and almost enclosed. Therefore, also in case of rapid movement perpendicular with respect to the surface of the substrates 5, hardly no forces caused by air turbulences can be exerted on the substrates 5. In case of rapid movement, such air turbulences might cause pre-damage or even fracturing of the fragile substrates 5. In the present invention, the air turbulences have almost no influence on the substrates 5, but they occur only outside the system consisting of collection container 3 and lock cover 18.

Outside the chamber 1 (not shown in FIGS. 2*a* to 2*c*), the substrate support 7 with the processed substrates 5 is delivered to a device (not shown) for further processing. The collection container 3 is emptied. Alternatively, the emptying movement of the collection container 3 is only made if substrate fragments 19 are in the collection container. Whether or not substrate fragments 19 are in the collection container 3 can be determined, e.g., by means of a suitable sensor. Then, the collection container 3 is again provided for introduction. To this end, the collection container is again connected with a substrate support 7 with substrates 5 and attached to the lock cover 18. By using the arm 9, the almost closed box, which consists of the collection container 3, the substrate support 7 with substrates 5 and the lock cover 18, is lifted into the chamber 1 or lock 2 and placed on the closure means 16. If a plurality of lock covers 18 and collection containers 3 are used, each lock cover 18 can always be respectively connected with the same collection container 3.

After the substrates 5 have been replaced, the lock cover 18 is again sealed against the outer side of the top 31 of the chamber and the lock 2 is evacuated. By lowering the lifting means 17, the deflectable sealing frame 6 is brought back into its central position. The collection container 3, which rests on the closure means 16, is lowered and transfers the substrate support 7 with the still untreated substrates 5 to the transport means 4. The substrate support 7 is suspended in the suspension means 8 of the deflectable sealing frame 6 of the transport means 4, and by further lowering the lifting means 17 with the collection container 3 resting thereon, the centering pins 20 release the substrate support 7 with the substrate 5. The transport means 4 can then transport the introduced substrate 5 to the next working area (e.g. heating area, process area, etc.) and move the next substrates 5 into the lock area 2 for removing them.

For rendering the course of the processes as effective as possible on the basis of the method of the invention and the device of the invention, each process step must take place within a specific period of time. After this time, the substrates 5 are transported forward. All processes described above, such as transporting the substrates 5 into the lock, lifting the substrate support 7 when sealing and flooding the lock, lifting the almost closed box consisting of collection container 3 and lock cover 18, replacing the substrates 5 and emptying the collection container 3 as well as introducing the new substrates 5 thus take place in the machine cycle.

In the shown embodiment, the centering pins 20 at the same time serve for receiving the substrate support 7 and for suspending the latter at the lock cover 18. By using an arm 9, the lock cover 18 is transported together with the substrate support 7, the substrates 5 and the collection container 3 from the lock to the next working station.

Alternatively, the centering pins can be used for receiving the substrate support only. In this case, a receiving element, e.g. a centering hook, is necessary for connecting the lock cover with the collection container.

Further, it is also possible or preferred to provide the centering pins only as connector between the collection container and the substrate support, and, after the lock was opened by removing the lock cover, grasp the substrate support with the substrate and the collection container attached to the substrate support by means of a suitable handling or transport means (not shown) and transport it to the next working station. Introduction then takes place accordingly in reversed order.

For removing a substrate 5, a partial volume of the chamber 1 must be separated in a vacuum-tight manner. The separation can be realized by means of the deflectable sealing frame 6 of the transport means 4. A small volume of the area to be separated leads to a quick flooding and evacuation of the partial area during introduction and removal. Thus, short cycle times of the facility or machine are possible. In accordance with the invention, the substrate fragments 19 can be removed from the chamber 1 of the facility of machine together with the collection container 3 and the substrates 5 in the machine cycle. In principle, the facility does not have to be stopped for removing substrate fragments 19 because the removal of the substrate fragments and the removal of the substrates take place simultaneously. Thus, the risk of a machine stop caused by substrate fragments 19 in the lock 2 is reduced. Moreover, the risk of damage to the facility (e.g. to vacuum seals) caused by sharp-edged substrate fragments 19 is reduced. Likewise, the risk that swirled-up substrate fragments 19 deposit on the substrates 5 or vacuum sealing surfaces is reduced.

The invention claimed is:

1. A chamber comprising a lock (2) with a removable lock cover (18) and a device for introducing substrates (5) into the chamber (1) and/or for removing substrates (5) from the chamber (1) as well as for collecting substrate fragments (19), the device comprising:
    a transport means (4) for transporting the substrate (5) in a horizontal XY-plane, inside the chamber (1) to an area of the lock;
    a sealing frame (6) held in the transport means (4) and being movable in a Z-direction perpendicular to the XY-plane;
    a substrate support (7) for sealing the substrates (5), being engageable with the sealing frame (6) and liftable in a Z-direction from the sealing frame;
    a closure means (16) for closing and opening a lower side of the sealing frame (6) and for lifting and lowering the sealing frame (6) relative to the transport means (4), the closure means being movable in the Z-direction via a lifting means (17); and
    a collection container (3) positioned below the substrate support (7) and being movable together with the closure means (16) to be lifted or lowered in the Z-direction for lifting and lowering the substrate support (7) and for releasably connecting the collection container (3) with the lock cover (18).

2. The chamber according to claim 1, comprising centering pins (20) for connecting the collection container (3) with the substrate support (7), and moving means (9) for transporting the collection container (3) together with the substrate support (7), the substrates (5) and the substrate fragments (19) in a machine cycle into the lock (2) and/or out of the lock (2).

3. The chamber according to claim 1, comprising means outside the chamber (1) for receiving the substrate support (7) with a processed substrate (5) from the collection container (3) and for delivering a substrate support (7) with a new substrate (5) to the collection container (3).

4. The chamber according to claim 1, wherein the lock cover (18) forms together with the collection container (3) a closed box around the substrates (5).

5. The chamber according to claim 1, wherein the transport means (4) comprises a rotary plate.

6. The chamber according to claim 1, wherein the lock cover (18) is flat.

7. A method for introducing substrates (5) into a chamber (1) and/or for removing processed substrates (5) from the chamber (1), using a device according to claim 1, comprising the steps of:
    a) providing the device of claim 1,
    b) transporting processed substrates (5) into the lock (2) within the chamber (1) using the transport means (4) and the lifting means (17),
    c) sealing the lock (2) against the chamber (1),
    d) flooding the lock (2) by lifting the sealing frame (16) using the lifting means (17) and the closure means (16), and
    e) removing the substrates (5) from the chamber (1) together with the collection container (3).

8. The method according to claim 7, wherein the substrate fragments (19) in the collection container (3) are collected below the substrates (5).

9. The method according to claim 7, comprising the additional steps of:
    f) delivering the processed substrates (5) to a next processing means and emptying the collection container (3) outside the chamber (1),
    g) introducing new substrates (5) together with an empty collection container (3), and
    h) evacuating the lock (2) and transporting the new substrates (5) out of the lock (2) into the chamber (1).

10. The method according to claim 9, wherein an emptying movement of the collection container (3) is only performed substrate fragments (19) are contained therein.

11. The method according to claim 7, wherein during introduction into the lock, the collection container (3) supporting the substrate support (7) is lowered for delivering the substrate support (7) with the substrates (5) to the transport means (4) and for separating the collection container (3) from the substrate support (7).

12. The method according to claim 7, wherein plurality of collection containers (3) and lock covers (18) are used.

* * * * *